United States Patent [19]

Gersho

[11] 4,012,628
[45] Mar. 15, 1977

[54] FILTER WITH A REDUCED NUMBER OF SHIFT REGISTER TAPS

[75] Inventor: Allen Gersho, Berkeley Heights, N.J.
[73] Assignee: Bell Telephone Laboratories, Incorporated, Murray Hill, N.J.
[22] Filed: Aug. 15, 1975
[21] Appl. No.: 605,073
[52] U.S. Cl. .............................. 235/156; 328/167; 333/70 T; 325/42
[51] Int. Cl.² ...................... G06F 7/38; H04B 3/04
[58] Field of Search ............ 235/156, 152; 325/42; 333/18, 28 R, 70 T; 328/167

[56] References Cited

UNITED STATES PATENTS

| | | | |
|---|---|---|---|
| 3,105,197 | 9/1963 | Aiken | 333/70 T |
| 3,521,041 | 7/1970 | Van Blerkom et al. | 235/156 |
| 3,573,623 | 4/1971 | Bannon et al. | 325/42 |
| R27,047 | 2/1971 | Lucky | 325/42 |

*Primary Examiner*—Joseph F. Ruggiero
*Attorney, Agent, or Firm*—H. L. Logan; J. S. Cubert

[57] ABSTRACT

Disclosed is a discrete-time filter configuration employing a shift register having output taps at only preselected stages for developing an output signal that is responsive to the signal of each stage of a shift register. The desired output signal is computed in a filter processing network by multiplying each of the output taps signals by a plurality of filter coefficients, by appropriately delaying the multiplied signals and by summing the delayed signals to produce the desired output signal.

17 Claims, 6 Drawing Figures

FILTER WITH A REDUCED NUMBER OF SHIFT REGISTER TAPS

BACKGROUND OF THE INVENTION

This invention relates to signal filtering and, more particularly, to signal filtering of discrete-time signals. For a general discussion of discrete-time (sampled) filters and particularly of discrete-time and amplitude (digital) filters and some of their application, reference is made to *Digital Processing of Signals* by B. Gold and C. M. Rader, McGraw-Hill Book Company, 1969.

Recursive filters comprise a powerful class of filters because they can be easily designed to have sharp cutoffs and because high order recursive filters can be constructed by concatenating low order filters. Nonrecursive filters, on the other hand, can be designed to have a linear phase response but cannot obtain sharp cutoffs without the use of filter orders which are much higher than the filter orders of equivalent recursive filters. Because of the increased hardware required for sharp cutoff filters, nonrecursive filters have not, heretofore, been extensively used in the filter art. With the advent of large scale integrated circuit technology, however, this impediment of nonrecursive filters is circumvented because the circuitry can be integrated and thus be made conveniently small and economical. The one problem which still remains with high order nonrecursive (transversal) filters is the large number of leads that need to be provided between the integrated shift register stages required in the filters and the arithmetic circuits of the filters. Leads occupy space, require pins for connecting to the integrated circuits, and require internal interconnections. This translates into increased costs.

SUMMARY OF THE INVENTION

It is, therefore, an object of this invention to provide a more economical configuration for high order nonrecursive filters.

It is another object of this invention to provide a filter configuration which reduces the number of shift register taps required in the implementation of various filter configurations.

These and other objects are achieved by realizing that a filter input-output relationship of the form $$z = \sum_{i=o}^{N} C_i D^i x,$$

can be rewritten in the form $$z = \sum_{i=o}^{m-1} D^i \sum_{k=o}^{N/m'} C_{mk+i} D^{mk} x,$$

where N is the order of the filter, x is the input signal, $D^i$ is an i unit delay, the $C_i$'s are filter coefficients, m is a preselected integer, N/m' is the fraction N/m truncated to its largest integer, and $C_i$ is taken as zero for $i > N$.

In accordance with the principles of this invention, the rewritten form is implemented with a shift register having N/m' taps at intervals of m units delay (developing thereby (N/m'+1) signals defined by the expression $D^{mk}x$ with k assuming the values 0, 1, 2, ... N/m'), and with a filter processing network which includes a) means for multiplying the $D^{mk}$s signals by appropriate filter coefficients, b) means for appropriately summing and delaying the (N/m'+1) product signals and c) means for appropriately summing the summed and delayed product signals to develop the signal z.

DETAILED DESCRIPTION

Figure 1:
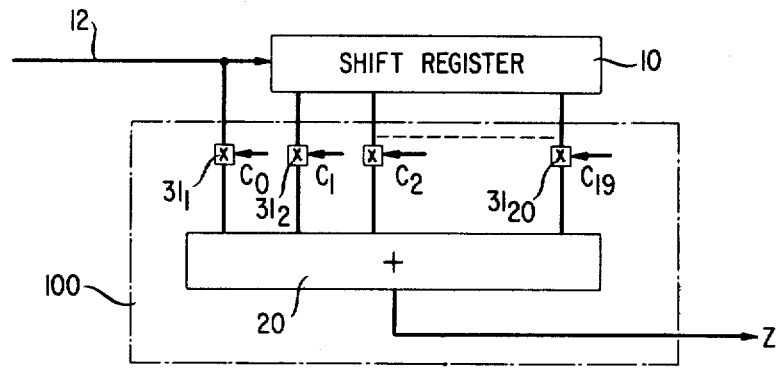
FIG. 1 depicts a prior art configuration of a non-recursive filter.

FIG. 1 depicts a block diagram of a prior art transversal filter. The order 19 filter shown in FIG. 1 includes a 19 stage shift register 10 responsive to an input signal on lead 12, and a filter processing network 100 responsive to the input signal and to the output signal of every stage of shift register 10. Filter processing network 100 comprises a set of multipliers $31_1, 31_2, \ldots 31_{20}$ associated with the signals applied to network 100. Each one of the multipliers in network 100 is connected to a corresponding one of the signals applied to network 100 and is arranged to multiply the applied signal by a preselected constant, or a filter coefficient. Thus, in FIG. 1, a multiplier $31_1$ multiplies the input signal on lead 12 by coefficient $C_0$, multiplier $31_2$ multiplies the signal output of the first stage of register 10 by coefficient $C_1$, while multiplier $31_{19}$ multiplies the signal output of the last stage of register 10 by coefficient $C_{19}$. The output signals of multipliers $31_1, 31_2, \ldots 31_{20}$ are added to each other in a summing network 20. Signal z, which is the output signal of network 20, comprises the output signal of the filter processing network 100 and also comprises the output signal of the transversal filter of FIG. 1.

The prior art filter of FIG. 1 is a discrete-time filter which is responsive to a sampled input signal x. The input signal may be an analog sampled signal or a quantized and coded sampled signal, i.e., a digital signal. Shift register 10 and processing network 100 are, of course, compatible with the nature of the input signal appearing on lead 12.

Because it is a sampled system, each stage of shift register 10 stores one signal sample, or word, of the sampled signal x, and thus each stage of shift register 10 provides a one word delay D. Therefore, the output signals of shift register 10 can be expressed as Dx, $D^2x$, $D^3x$, ... $D^{19}$s, where $D^3x$, for example, represents the signal x delayed by a 3 word delay — or the signal output of the third stage of shift register 10. Utilizing the above nomenclature, the output signal z of the FIG. 1 circuit may be expressed by the canonic equation $$z = \sum_{i=o}^{N} C_i D^i x \qquad (1)$$

where N is the order of the filter and the $C_i$ are the filter coefficients.

It has been discovered that the canonic expression of equation (1) may be equivalently written in the form $$z = \sum_{i=0}^{m-1} D^i \sum_{k=0}^{N/m'} C_{km+i} D^{mk} x \quad (2)$$

where $m$ is an arbitrarily chosen integer, where $N/m'$ is the fraction $N/m$ truncated to its integer portion and where $C_i$ equals zero for $i > N$. It has been further discovered that the signal z may be computed by evaluating equation (2) in two steps.

The first step evaluates the expression $$Y_i = \sum_{k=0}^{N/m'} C_{km+i} (D^m)^k x \quad (3)$$

for various values of $i$, and the second step develops the signal z by evaluating the expression $$z = \sum_{i=0}^{m-1} D^i Y_i. \quad (4)$$

Equation (3) is similar in form to equation (1). It is different from equation (1) in that the number of terms in equation (3) is $N/m'$ rather than N, in that only coefficients $C_{km+i}$ are employed rather than all the $C_i$ coefficients, and in that instead of the unit delays of equation (1) equation (3) contains delays of m units delays each. Because of the similarity in form, equation (3) may be implemented with structure not unlike that which implements equation (1), i.e., FIG. 1. Thus, the circuit implementing equation (3) employs a shift register having $N/m'$ number of delays with each delay being m units long, and a filter processing network which computes the signals $Y_i$ by employing coefficients $C_{mk+i}$. Once the $Y_i$ signals of equation (3) are evaluated, the desired signal z may be developed by evaluating equation (4). The circuit for evaluating equation (4) involves a relatively simple structure, as shown below.

Figure 2:
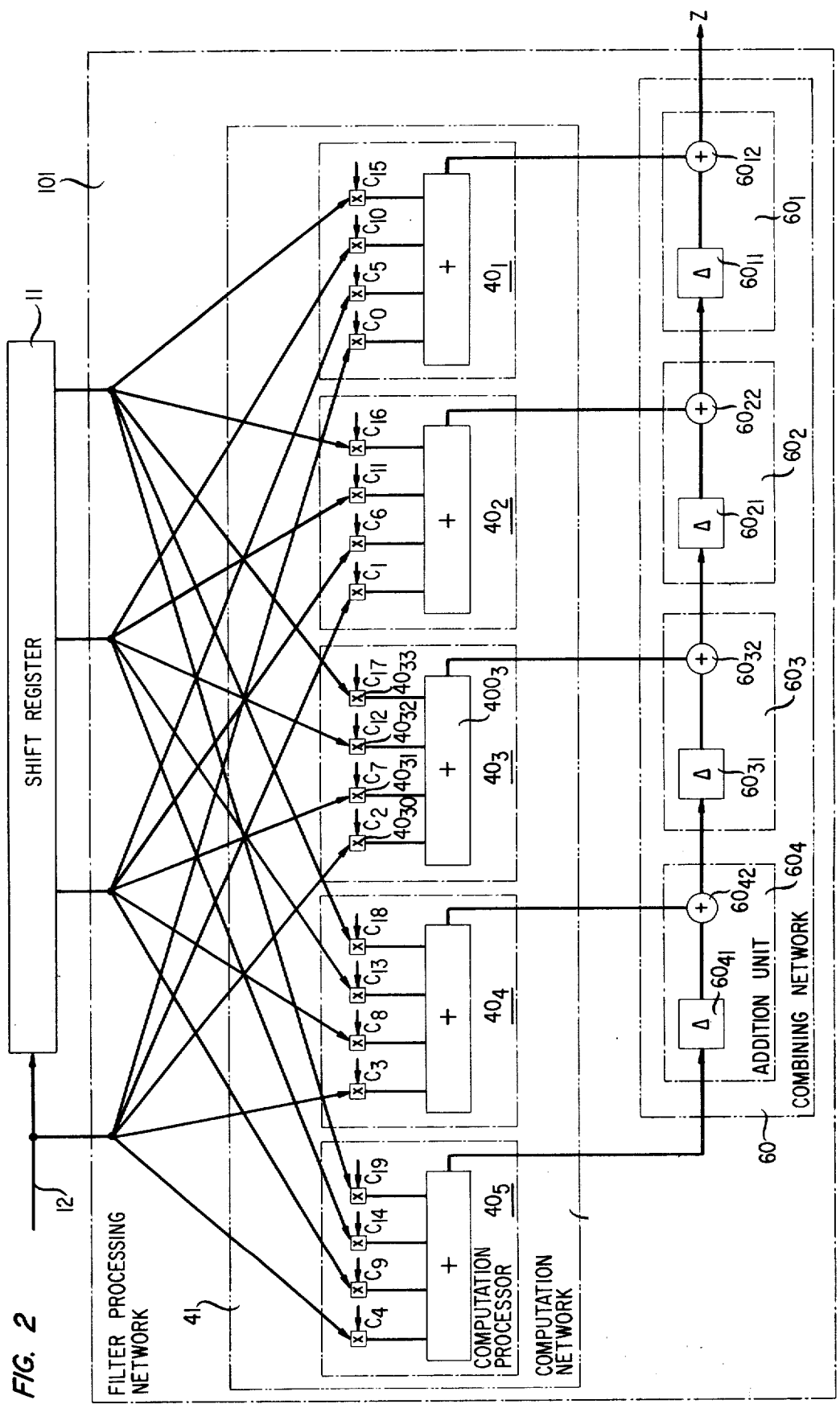
FIG. 2 illustrates one embodiment of a filter configuration in accordance with the principles of this invention.

FIG. 2 depicts one embodiment of a circuit employing the principles of this invention. As in FIG. 1, lead 12 applies the input signal x to a shift register. Unlike in FIG. 1, however, lead 12 is connected to a shift register 11 which provides only $N/m'$ output leads. These leads emanate from shift register stages that are m units delay apart. Thus, including lead 12, shift register 11 provides $(N/m'+1)$ output leads. In the particular embodiment illustrated in FIG. 2, $m=5$, $N/m'=19/5$ truncated, or 3, and $N/m'+1 = 4$. The $(N/m'+1)$ output leads of register 11 are connected to filter processing network 101 and to a computation network 41 within filter processing network 101. In computation network 41, the $(N/m'+1)$ output leads of register 11 are connected to each of computation processors $40_1, 40_2, \ldots 40_i, \ldots 40_m$. Within each computation processor $40_i$ there are multipliers $40_{i0}, 40_{i1}, \ldots 40_{ik}, \ldots 40_{i(N/m')}$ for multiplying signals $x, D^m x, \ldots D^{mk} x, \ldots D^{m(N/m')} x$ by coefficients $C_{(i-1)}, C_{m+(i-1)}, C_{2m+(i-1)}, \ldots C_{(N/m')m+(i-1)}$, respectively. Additionally, within each computation processor $40_i$ there is an adder circuit $400_i$ for adding the multiplied signals to each other to form the intermediate signal $Y_i$. For example, computation processor $40_3$ ($i=3$) in FIG. 2 multiplies the input signal x by $C_2$ (in multiplier $40_{30}$), the signal of the first shift register output signal by $C_7$ (in multiplier $40_{31}$), the signal of the second shift register output by $C_{12}$ (in multiplier $40_{32}$), and the signal of the third shift register output by $C_{17}$ (in multiplier $40_{33}$). The multiplied signals are added in summer $400_3$ to form the signal $Y_3$.

Combining network 60 develops the signal z in accordance with equation (4). Therefore, combining network 60 is a responsive to the $Y_i$ signals developed by the computation processors in computation network 41 and comprises delay elements and adders arranged to properly delay and add the $Y_i$ signals to form the signal z. In the illustrative embodiment of FIG. 2, combining network 60 comprises a series, or cascade, interconnection of addition units $60_1, 60_2, \ldots 60_i, \ldots 60_{m-1}$. Ech addition unit $60_i$ includes a unit delay element $60_{i1}$ having its input comprise a first input terminal of addition unit $60_i$, and further includes a two input adder $60_{i2}$ whose one input is connected to the output terminal of unit delay element $60_{i1}$, whose other input comprises a second input terminal of addition unit $60_i$, and whose output comprises the output terminal of addition unit $60_i$. The cascade interconnection of the addition units is formed by connecting the output signal of each addition unit $60_i$ to the first input terminal of the subsequent addition unit $60_{i+1}$. Combining network 60 is connected to computation network 41 by connecting the second input terminal of each addition unit $60_i$ to the output signal of each computation processor $40_i$, i.e., to signal $Y_i$. With respect to the end point connections, the first input terminal of addition unit $60_{m-1}$ (the last addition unit in the cascade interconnection) is connected to the output signal of computation processor $40_m$, and the output signal of addition unit $60_1$ comprises the output signal z.

Figure 3:
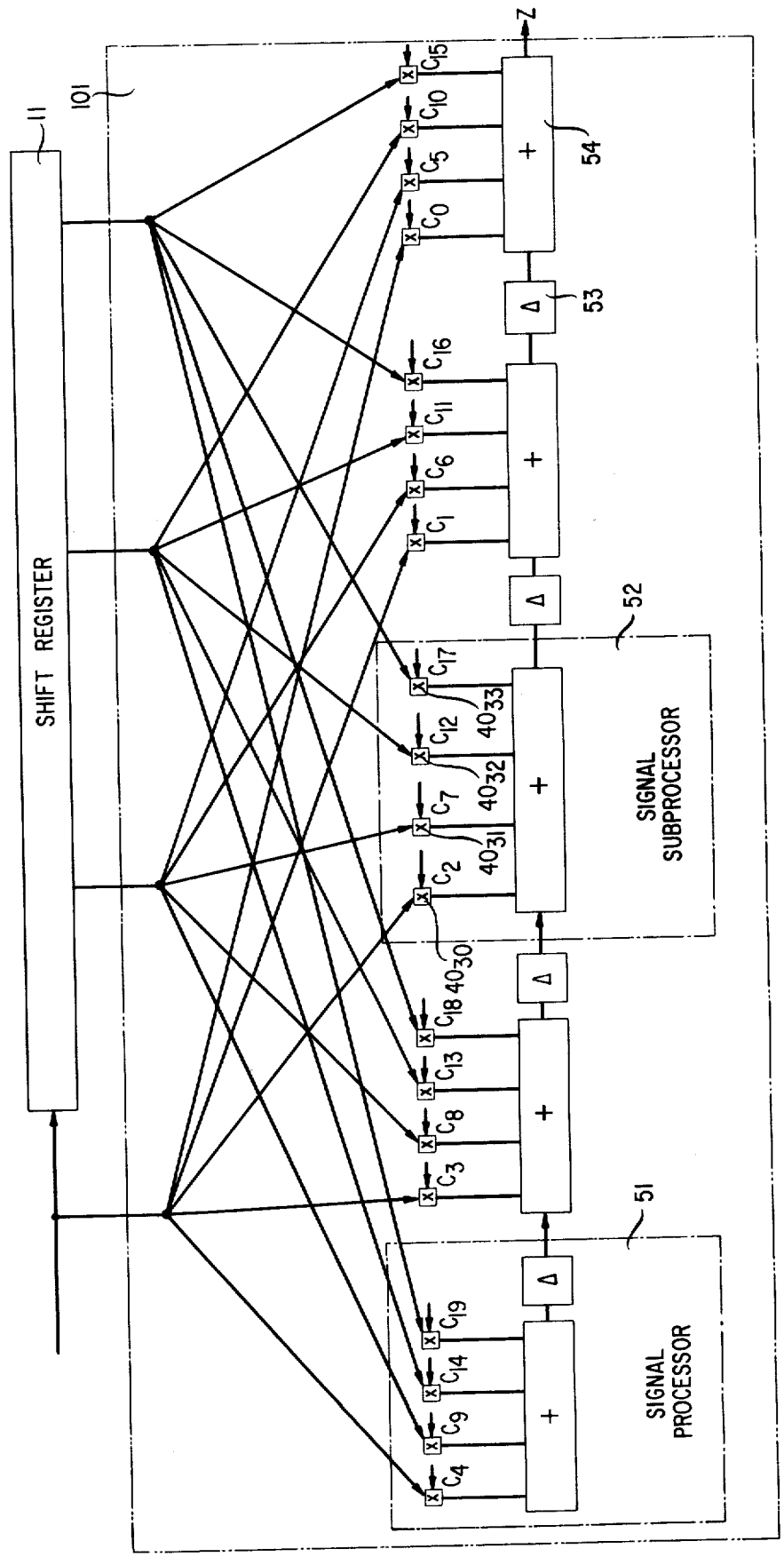
FIGS. 3 and 4 present alternate representations of the filter configuration of FIG. 2.

A perusal of FIG. 2 reveals that the adder in each addition unit in FIG. 2 is responsive to the summer output signal within a corresponding computation processor. These two summing elements may conveniently be combined to form a single adder, and when thus combined, the filter processing network of FIG. 2, can be represented as shown in FIG. 3. For easier graphical representation, the elements in the filter processing network of FIG. 3 may be grouped into signal subprocessors, e.g., element 52, interconnected in cascade with a single unit delay element interposed between each pair of signal subprocessing. Alternatively, the elements in the filter processing network of FIG. 3 may be grouped into a cascade interconnection of signal processors, e.g., element 51. Thus, both FIGS. 2 and 3 perform the same function and develop the same output signal z by the use of essentially identical structural elements. Only the graphical positioning and grouping of the structural elements, i.e., the representation, is different between the illustrations of FIGS. 2 and 3.

Figure 4:
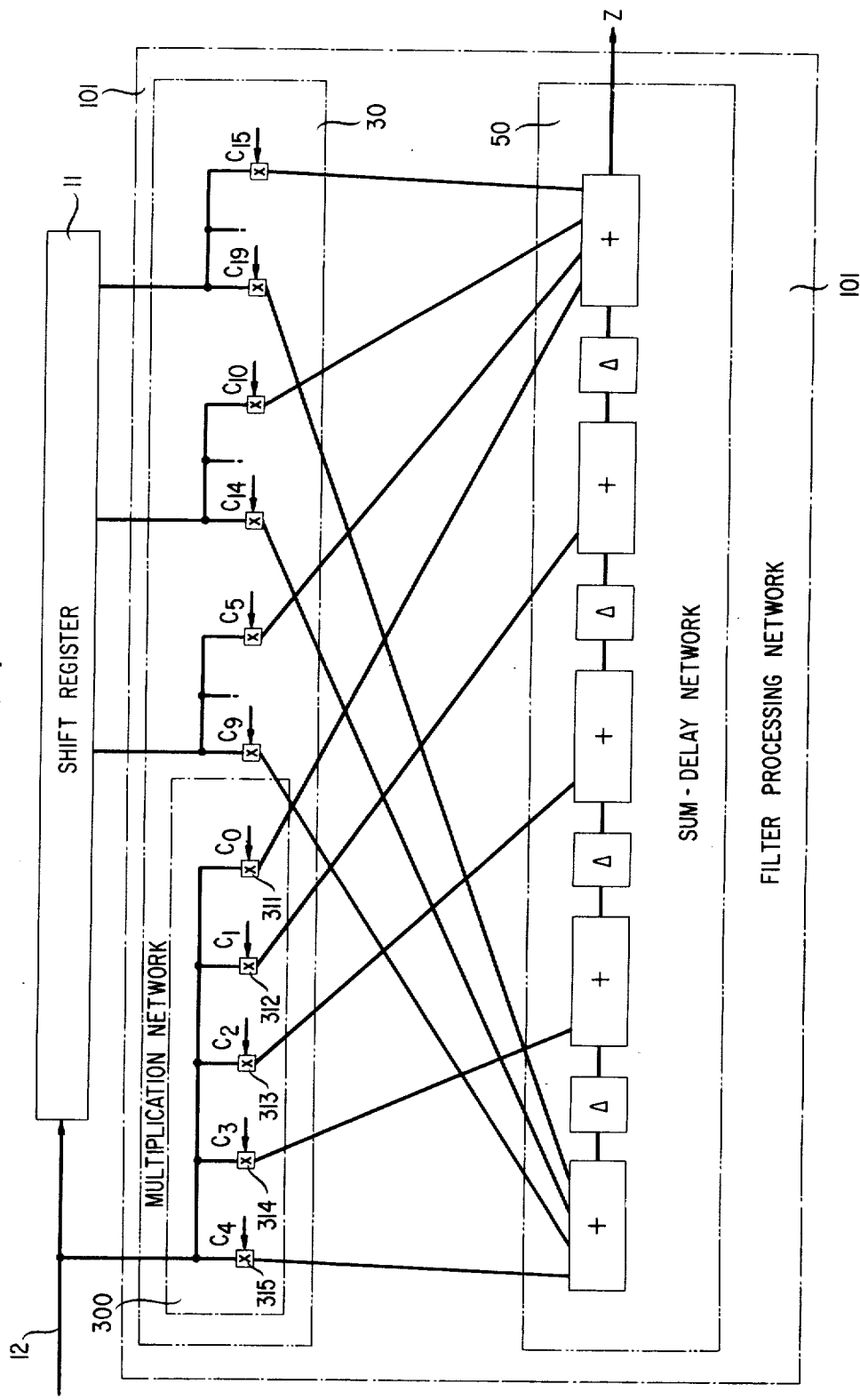

FIG. 4 depicts a still different representation of the circuits of FIGS. 2 and 3. In FIG. 4, all of the multipliers located in the filter processing network (101) of FIG. 2 are grouped in a multiplication network 30, while the adders and the delay elements remaining in filter processing network 101 are grouped in a sum-delay network 50. The output signal z of network 50 is, thus, identical to the output signal z of FIGS. 2 and 3. For easier representation, network 30 may be thought of as comprising $(N/m' + 1)$ sets of multipliers (e.g., element 300) with each set of multipliers being responsive to one of the input signals of network 30.

Figure 5:
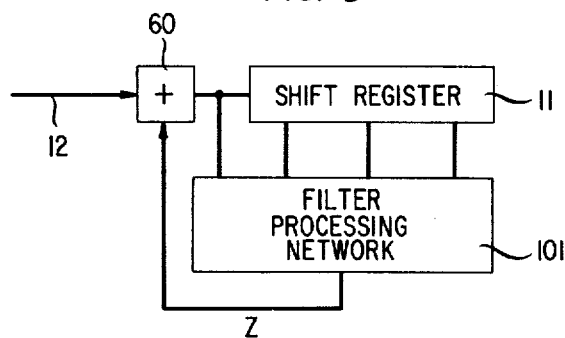
FIG. 5 depicts a recursive filter configuration which employs the principles of this invention.
Figure 6:
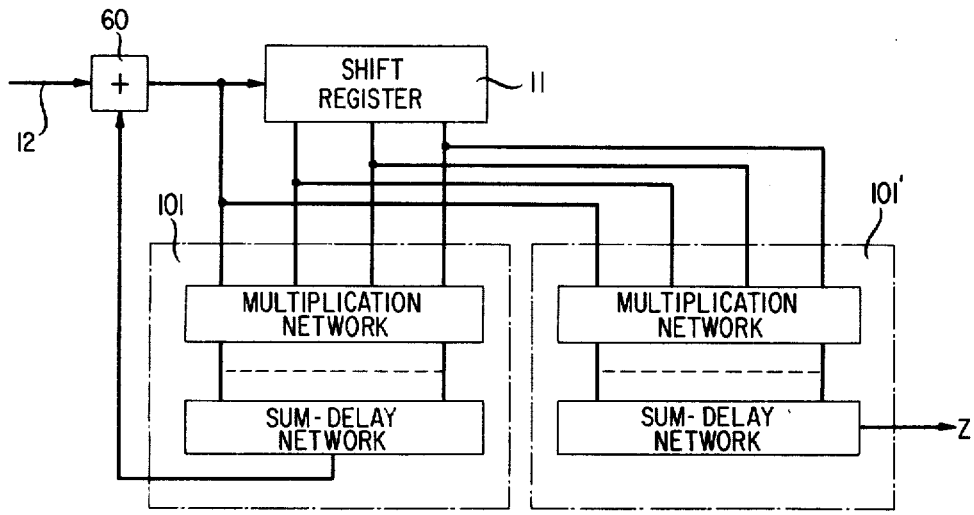
FIG. 6 illustrates a filter configuration having recursive and nonrecursive sections, both of which employ the principles of this invention.

FIGS. 2, 3, and 4, as shown, depict a transversal filter. To wit, the output signal z of the FIGS. 2, 3, and 4 circuits is a linear combination of a fixed number of past samples of the input signal x. The filter processing network 101 is not limited, however, to transversal filter applications. For example, FIG. 5 depicts a recursive filter configuration utilizing a shift register 11 responsive to a first signal, a filter processing network 101 connected to the above-mentioned first signal and to the output signals of shift register 11, and a summing network 60 for appropriately combining the input signal x with the output signal of network 101 to form the above-mentioned first signal. The output signal of the FIG. 5 circuit may be derived from any accessible terminal in the circuit and is, effectively, a function of all of the past samples of the input signal x. Accordingly, the output signal of the FIG. 5 circuit may be the output signal of adder 60, the output signal of any of the stages of shift register 11, or any combination thereof. In fact, a FIG. 5 filter output signal which is a linear combination of the input and output signals of register 11 can be implemented with a secondary filter processing network. This is illustrated in FIG. 6 where a secondary filter processing network 101' is added to the FIG. 5 circuit structure and is connected to the output signal of adder 60 and to each of the output signals of shift register 11.

What is claimed is:

1. A digital filter responsive to a signal x, including a shift register of N stages which provides output signals at each stage of said shift register, which signals are representable by the expressiion $D^i x$ where $D^i x$ is the output signal of the $i^{th}$ stage of said shift register, including a filter processing network which, in turn, includes means for multiplying the output signals of said shift register by preselected filter constants, and including an output terminal responsive to a preselected output signal in said digital filter, characterized in that:

said filter processing network is responsive solely to said signal x and to the output signal of every $m^{th}$ stage of said shift register to develop a network signal z characterized by the expression $$z = \sum_{i=o}^{m-1} D^i \left[ \sum_{k=o}^{N/m'} C_{mk+i} D^{mk} x \right]$$

where $m$ is the prechosen integer constant greater than one, $N/m'$ is the largest integer included in the fraction $N/m$, the $C_{mk+i}$'s are filter coefficients with $C_j$ equal to zero for $j > N$, and $D^i$ represents a delay of $i$ units applied to the signal represented by the expression within the square brackets.

2. The digital filter of claim 1 wherein said filter processing network comprises:

a multiplication network responsive solely to said input signal x and to said output signal of every $m^{th}$ stage of said shift register for developing a plurality of output signals, each of which is a different weighted sum of said input signal x and said output signal of every $m^{th}$ stage of said shift register; and sum-delay means for forming delayed replicas of said plurality of output signals of said multiplication network and for adding said delayed replicas with each other to form said network signal z.

3. The circuit of claim 2 wherein said network signal z is fed back and added to said input signal x to cause said digital filter to be a recursive digital filter.

4. A non-recursive filter, responsive to an input signal x, including a shift register of N stages which provides an output signal at each one of its N stages of delay and further including a filter processing network for developing a filter output signal z representable by the expression $$z = \sum_{i=o}^{N} C_i (D^i x)$$

where each $C_i$ factor is a preselected filter coefficient and where each $(D^i x)$ factor represents the signal developed by the $i^{th}$ stage of said stage register, characterized in that:

said filter processing network is responsive solely to said input signal and to every $m^{th}$ output signal of said shift register, where m is a preselected integer constant greater than one, and develops said filter output signal z by evaulating the expression $$z = \sum_{i=o}^{m-1} D^i \left[ \sum_{k=o}^{N/m'} C_{mk+i} (D^{mk} x) \right]$$

where $N/m'$ is the fraction $N/m'$ truncated to an integer, and where $D^i$ represents a delay of $i$ units delay applied to the signal represented by the expression in the square brackets.

5. An Nth order digital filter circuit responsive to an input signal x comprising:

a shift register responsive to said input signal and having $N/m'$ taps spaced at intervals of m stages of delay, where m is a preselected integer constant greater than one and $N/m'$ is the fraction $Nm$ truncated to an integer; and a filter processing network responsive solely to said input signal and to the output signals of said taps for developing a filter output signal z by evaluating the expression $$z = \sum_{i=o}^{m-1} D^i \left[ \sum_{k=o}^{N/m'} C_{km+i} D^{mk}(x) \right]$$

where $D^i$ represents a delay of $i$ units delay of the signal represented by the expression in the square brackets, $D^{mk}(x)$ represents a delay of mk units delay of the signal x, and where each $C_{km+i}$ is a filter constant coefficient.

6. A filter circuit responsive to an input signal x comprising:

a shift register responsive to said input signal and having n output taps spaced at intervals of m stages of delay, where $m$ is a preselected integer constant greater than one, thereby developing a set of output signals $D^{0m}x, D^{1m}x, D^{2m}x, \ldots D^{nm}x$, where $D^{km}x$ represents the signal at the $k^{th}$ output tap of said shift register; and a filter procesing network responsive solely to said input and output signals for developing a filter output signal z by forming a signal corresponding to the expression $$z = \sum_{i=o}^{m-1} D^i \left[ \sum_{k=o}^{q} C_{km+i} D^{km} x \right]$$

where the $C_{km+i}$ factors are preselected filter coefficients and where $D^i$ is a delay of $i$ units delay applied to the signal represented by the expression in the square brackets.

7. An Nth order transversal filter for developing an output signal z comprising:
   a shift register responsive to an applied signal $x$ and developing a set of output signals $D^{0m}x$, $D^{1m}x$, $D^{2m}x$, $D^{3m}x$, ... $D^{km}x$, ... $D^{(N/m')m}x$, where $D^{km}x$ represents the signal $x$ delayed by km units delay, where m is a prechosen integer, and where N/m' is the fraction N/m rounded off to the next lower integer;
   means for developing weighted sum signals $Y_0$, $Y_1$, $Y_2$, ... $Y_i$, ... $Y_{m-1}$ where each of the $Y_i$ signals is formed by evaluating the expression $$Y_i = \sum_{k=o}^{N/m'} C_{km+i} D^{mk} x$$

and where each of the $C_{km+i}$ terms is a preselected multiplicative constant; and
   means for summing delayed replicas of said weighted sum signals in accordance with the expression $$z = \sum_{i=o}^{m-1} D^i Y_i$$

where the expression $D^i Y_i$ represents the signal $Y_i$ delayed by $i$ units delay.

8. A filter circuit adapted for processing an input signal comprising:
   a shift register responsive to said input signal and having a plurality of output taps, spaced at equal delay intervals, for developing a plurality of output signals; and
   a cascade interconnection of m signal processors responsive to said input signal and to said plurality of output signals,
      where the first signal processor in said cascade interconnection develops an output signal that is a weighted sum, delayed by a single unit delay, of said input signal and of said output signals,
      where each subsequent signal processor in said cascade interconnection, other than the last signal processor, develops an output signal that is a weighted sum, delayed by a single unit delay, of the output signal of the immediately preceding signal processor in said cascade interconnecting of said input signals, and of said plurality of output signals, and
      where the last signal processor in said cascade interconnection develops a filter output signal that is a weighted sum of the output signal of the preceding signal processor in said cascade interconnection, of said input signal, and of said plurality of output signals.

9. The filter of claim 8,
   wherein said first signal processor in said cascade interconnection comprises;
      a plurality of multipliers for multiplying said input signal and each of said plurality of output signal by preselected constants,
      means for adding the multiplied signals, and
      a single unit delay, responsive to said means for adding, for developing said output signal of said first processor;
   wherein each of said subsequent signal processors comprises;
      a plurality of multipliers for multiplying said input signal and each of said plurality of output signals by prechosen constants,
      means for adding the multiplied signals with the output signal of a preceding signal processor in said cascade interconnection of signal processors, and
      a single unit delay, responsive to said means for adding, for developing said output signal of each of said subsequent signal processors; and
   wherein said last signal processor in said cascade interconnection comprises:
      a plurality of multipliers for multiplying said input signal and each of said plurality of output signals by prechosen constants, and
      means for adding the multiplied signals with the output signal of the preceding signal processor in said cascade interconnection of signal processors to form said filter output signal.

10. A filter responsive to an applied input signal comprising:
   a shift register of mn stages having n output taps distributed at intervals of m stages and developing a set of n+1 output signals consisting of said input signal and the n output signals of said shift register; and
   m signal subprocessors connected to said set of n+1 output signals and further interconnected in cascade with m−1 unit delay elements, having one unit delay element interposed between each pair of successive signal subprocessors, with each of said subprocessors developing an output signal that is representative of a weighted sum of the output signal of the preceding delay element in said cascade interconnections and of said n+1 output signals and which is applied to the succeeding delay element in said cascade interconnection, wherein the output signal of the last signal subprocessor in said cascade interconnection comprises the output signal of said filter.

11. A filter comprising:
   a shift register having an input terminal and a plurality of output terminals spaced at intervals of m unit delays;
   a computation network connected to said input terminal and to said plurality of output terminals for developing a multiplicity of output signals, each of which is a different weighted sum of the signals at said input terminal and at said plurality of output terminals; and
   combining means for forming delayed replicas of said multiplicity of output signals of said computation network and for adding said delayed replicas with each other to form an output signal of said filter.

12. The filter of claim 11 wherein said combining means comprises:
   a cascade interconnection of addition units, each of which includes a two input adder and a delay element of one unit delay connected to a first input of said two input adder,
a. where the delay element of the first addition unit in said cascade interconnection is connected to a prechosen output signal of said multiplicity of output signals,
b. where the delay element of every other addition unit is connected to the output terminal of the two input adder of the immediately preceding addition unit in said cascade interconnection,
c. where the second input of said two input adder in each of said addition units is connected to a different output signal of said multiplicity of output signals, and
d. where the output signal of the two input adder in the last addition unit in said cascade interconnection comprises said output signal of said filter.

13. A filter comprising:
a cascase interconnection of $n$ signal delay elements of m units delay each, said interconnection having an input terminal and n output terminals;
a cascade interconnection of m signal subprocesors with a delay element of one unit delay interposed between each pair of successive signal subprocessors, with each of said m subprocessors being further connected to said input terminal and to said n output terminals, and with each of said subprocessors developing an intermediate output signal applied to the succeeding delay element in said cascade interconnection that is representative of a weighted sum of (1) the output signal of the preceding delay element in said cascade interconnection, (2) of the input terminal's signal and (3) of the signal on said m output terminals; and
a filter output terminal, responsive to the intermediate output signal of the last signal subprocessor in said cascade interconnection for providing an output signal for said filter.

14. A filter circuit comprising:
a shift register for developing a set of output signals consisting of an input signal to said shift register and of a plurality of output signals extracted from equally spaced taps of said shift registers;
a plurality of multiplication units, with each one of said multiplication units being responsive to one output signal of said set of output signals and developing a multiplicity of output signals that are prechosen multiples of the output signal to which said each one of said multiplication units is responsive;
a plurality of delay elements having one unit delay each; and
a plurality of multi-input adders interconnected in cascade by applying the output signal of each of said adders, via one of said delay elements, to one input of the immediately successive adder in said cascade interconnection, with the remaining inputs of each of said multi-input adders being connected to a chosen one of said multiplicity of output signals of a preselected one of said plurality of multiplication units, and with the output signal of the last multi-input adder in said cascade interconnection comprising an output signal of said filter circuit.

15. An N order recursive filter comprising:
a shift register responsive to an applied signal x and developing a set of output signals $D^{0m}x$, $D^mx$, $D^{2m}x$, $D^{3m}x$, ... $D^{km}x$, ... $D^{(N/m')m}x$, each one of which is a potential filter output signal, where $D^{km}x$, represents the signal $x$ delayed by km units delay, where m is a prechosen integer and where $N/m'$ is the fraction $N/m$ truncated to an integer;
means for developing weighted sum signals $Y_0$, $Y_1$, $Y_2$, ... $Y_i$, ... $Y_{m-1}$, each one of which is a potential filter output signal, where each of the $Y_i$ signals is formed by evaluating the expression $$Y_i = \sum_{k=0}^{N/m'} C_{km+i} D^{mk}x$$

and where each of the $c_{km+i}$ terms is a preselected multiplicative constant;
means for forming delayed replicas of said weighted sum signals and for summing said delayed replicas to form a signal z in accordance with the expression $$z = \sum_{i=0}^{m-1} D^i Y_i$$

where the expression $D^i Y_i$ represents the signal $Y_i$ delayed by $i$ units delay;
means for appropriately summing said signal z with a filter input signal to form said applied signal x; and
a filter output terminal responsive to at least one of said potential filter output signals for developing a filter output signal.

16. A filter circuit adapted for processing an input signal comprising:
a shift register responsive to a first signal and having a plurality of output taps spaced at equal delay intervals, which taps develop a plurality of output signals;
a cascade interconnection of m signal processors responsive to said first signal and to said plurality of output signals,
where the first signal processor in said cascade interconnection develops an output that is a weighted sum, delayed by a single unit delay of said input signal and of said output signals,
where each subsequent signal processor, other than the last signal processor in said cascade interconnection, develops an output signal that is a weighted sum, delayed by a single unit delay, of the output signal of the immediately preceding signal processor in said cascade interconnection, of said input signal, and of said plurality of output signals, and
where the last signal processor in said cascade interconnection develops an intermediate signal that is a weighted sum of the output signal of the preceding signal processor in said cascade interconnection, of said input signal, and of said plurality of output signals; and
means to appropriately combining said intermediate signal with said applied input signal to form said first signal.

17. A filter comprising:
a shift register responsive to a first signal and having an input terminal and a plurality of output terminals spaced at intervals of m unit delays;
a computation network connected to said input terminal and to said plurality of output terminals for developing a multiplicity of output signals, each of which is a potential filter output signal and is representative of a different weighted sum of the signals at said input terminal and at said plurality of output terminals, which signals are also potential filter output signals;

combining means for adding delayed replicas of said multiplicity of output signals with each other to form an intermediate signal;

means for appropriately adding said intermediate signal with a filter input signal to form said first signal; and a filter output terminal responsive to at least one of said potential filter output signals.

* * * * *